(12) United States Patent
Hasenkopf et al.

(10) Patent No.: US 9,310,442 B2
(45) Date of Patent: Apr. 12, 2016

(54) BATTERY HAVING CELL VOLTAGE AND BATTERY CURRENT DETECTION AND COMPRISING ONLY ONE ELECTRICAL ISOLATION DEVICE

(75) Inventors: Dirk Hasenkopf, Stuttgart (DE); Stefan Butzmann, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 377 days.

(21) Appl. No.: 13/822,772

(22) PCT Filed: Aug. 9, 2011

(86) PCT No.: PCT/EP2011/063688
§ 371 (c)(1),
(2), (4) Date: Aug. 30, 2013

(87) PCT Pub. No.: WO2012/034792
PCT Pub. Date: Mar. 22, 2012

(65) Prior Publication Data
US 2013/0335096 A1    Dec. 19, 2013

(30) Foreign Application Priority Data
Sep. 14, 2010  (DE) .......................... 10 2010 040 713

(51) Int. Cl.
*H02J 7/00*     (2006.01)
*H02J 7/04*     (2006.01)
(Continued)

(52) U.S. Cl.
CPC ........... *G01R 31/362* (2013.01); *B60L 11/1855* (2013.01); *B60L 11/1864* (2013.01);
(Continued)

(58) Field of Classification Search
USPC ......... 320/116, 119, 134, 132, 106, 112, 118, 320/127, 128, 138, 136, 139; 324/426, 434, 324/433, 427, 429, 550, 601, 76.11
See application file for complete search history.

(56) References Cited

U.S. PATENT DOCUMENTS 5,726,554 A *  3/1998  Freiman et al. ............... 320/157
5,773,958 A     6/1998  Gow et al.
(Continued)

FOREIGN PATENT DOCUMENTS

CN    1293370 A       5/2001
DE    603 15 268 T2   4/2008
(Continued)

OTHER PUBLICATIONS

International Search Report corresponding to PCT Application No. PCT/EP2011/063688, mailed Nov. 29, 2011 (German and English language document) (9 pages).
(Continued)

*Primary Examiner* — Alexis A Boateng
(74) *Attorney, Agent, or Firm* — Maginot, Moore & Beck LLP

(57) ABSTRACT

A battery includes a plurality of battery cells connected in series between a positive terminal and a negative terminal and a resistor connected in series with the battery cells. The battery also includes a plurality of cell voltage detection units which each include a plurality of voltage measurement inputs connected to a respective group of the battery cells. The battery is configured to determine cell voltages of the battery cells connected to the respective cell voltage detection unit. The cell voltage detection units are connected to each other by a communication bus and are configured to transmit, via the communication bus, the determined cell voltages to a microcontroller which is galvanically decoupled from the cell voltage detection units by an electrical isolation device. The resistor includes a first connection connected to a selected voltage measurement input of one of the cell voltage detection units.

9 Claims, 3 Drawing Sheets

(51) Int. Cl.
*G01R 31/36* (2006.01)
*B60L 11/18* (2006.01)
*H01M 10/48* (2006.01)
*H01M 10/0525* (2010.01)

(52) U.S. Cl.
CPC ......... *G01R31/3658* (2013.01); *H01M 10/482* (2013.01); *B60L 2240/545* (2013.01); *B60L 2240/547* (2013.01); *B60L 2240/549* (2013.01); *H01M 10/0525* (2013.01); *H02J 7/0016* (2013.01); *H02J 7/0021* (2013.01); *H02J 7/0026* (2013.01); *Y02T 10/7005* (2013.01); *Y02T 10/7011* (2013.01); *Y02T 10/7061* (2013.01); *Y02T 90/16* (2013.01)

(56) References Cited

U.S. PATENT DOCUMENTS

| | | | | |
|---|---|---|---|---|
| 6,664,764 | B1* | 12/2003 | Odaohhara | 320/132 |
| 2007/0188149 | A1* | 8/2007 | Miyamoto | 320/134 |
| 2008/0012570 | A1* | 1/2008 | Bucur | 324/426 |
| 2008/0100266 | A1 | 5/2008 | Sobue | |
| 2008/0180106 | A1* | 7/2008 | Gorbold | 324/434 |
| 2008/0238432 | A1* | 10/2008 | Botker et al. | 324/434 |
| 2010/0060295 | A1* | 3/2010 | Ishikawa et al. | 324/601 |
| 2010/0185405 | A1* | 7/2010 | Aoshima et al. | 702/63 |
| 2010/0213891 | A1* | 8/2010 | Nishikawa et al. | 320/106 |
| 2010/0244847 | A1* | 9/2010 | Kudo et al. | 324/433 |

FOREIGN PATENT DOCUMENTS

| | | |
|---|---|---|
| DE | 10 2009 000 336 A | 7/2010 |
| EP | 1 933 443 A2 | 6/2008 |
| EP | 1 967 861 A2 | 9/2008 |
| EP | 2 224 257 A2 | 9/2010 |
| JP | 2001 025173 A | 1/2001 |

OTHER PUBLICATIONS

Webb et al.; Measuring individual cell voltages in fuel cell stacks; Journal of Power Sources; Dec. 30, 2001; pp. 54-60; vol. 103, No. 1; Elsevier.

Chatzakis et al.; Designing a New Generalized Battery Management System; IEEE Transactions on Industrial Electronics; Oct. 1, 2003; pp. 990-999; vol. 50, No. 5; Piscataway, USA.

Hande et al.; A Selective Boost Equalizer for Series Connected NiMH Battery Packs; Power Electronics in Transportation; Oct. 21, 2004; pp. 151-157; IEEE; Piscataway, USA.

Duran et al.; Measurement Method for PV Modules based on DC-DC Converters with Microcontroller; 13th European Conference on Power Electronics and Application; Sep. 8, 2009; pp. 1-10; Barcelona, Spain.

Cao et al.; Batteries Need Electronics: Battery Management Systems Vary According to Chemistry and Applications; IEEE Industrial Electronics Magazine; Mar. 1, 2011; pp. 27-35; vol. 5, No. 1; IEEE; USA.

Lee et al.; An Isolated DC/DC Converter Using High-Frequency Unregulated LLC Resonant Converter for Fuel Cell Applications; IEEE Transactions on Industrial Electronics; Jul. 1, 2011; vol. 58, No. 7; IEEE; Piscataway, USA.

* cited by examiner

BATTERY HAVING CELL VOLTAGE AND BATTERY CURRENT DETECTION AND COMPRISING ONLY ONE ELECTRICAL ISOLATION DEVICE

This application is a 35 U.S.C. §371 National Stage Application of PCT/EP2011/063688, filed on Aug. 9, 2011, which claims the benefit of priority to Serial No. DE 10 2010 040 713.5, filed on Sep. 14, 2010 in Germany, the disclosures of which are incorporated herein by reference in their entirety.

The present disclosure relates to a battery comprising only one electrical isolation device.

BACKGROUND

It is becoming apparent that in the future battery systems will be used increasingly both in stationary applications and in vehicles such as hybrid and electric vehicles. In order to be able to meet the requirements in respect of voltage and available power which are set for a specific application, a high number of battery cells are connected in series. Since the current provided by such a battery needs to flow through all of the battery cells and a battery cell can only conduct a limited current, often battery cells are additionally connected in parallel in order to increase the maximum current. This can be achieved either by providing a plurality of cell windings within a battery cell housing or by externally interconnecting battery cells.

For reasons of safety and in order to determine the state of charge of the battery with sufficient accuracy, various measured variables such as the voltages of the individual battery cells (cell voltages), the current through the battery and the temperature of selected or all battery cells are usually determined in such battery systems. These measured variables are detected, further-processed and, depending on the application, communicated to other parts of the apparatus by a control unit (battery control unit, BCU).

Since the battery voltage of such a battery system can reach high values, for safety reasons it needs to be constructed so as to be isolated from parts of the surrounding apparatus with which contact can be made. In particular in the case of battery systems which are used in motor vehicles as traction battery, this means that the battery system needs to be implemented so as to be isolated from the control unit because said control unit is connected to the low-voltage power supply system and communicates with other numerous components.

Such isolation or electrical isolation involves increased technical complexity, however, and increases the overall costs of the arrangement. It is therefore desirable to minimize the number of isolation points or electrical isolation points. In accordance with the prior art, depending on a respectively used semiconductor technology or the dielectric strength thereof a cell voltage detection unit which is manufactured using semiconductor technology wholly or partially as a microchip is used for a number of battery cells, for which the sum of the cell voltages does not place excess demands on the dielectric strength of the cell voltage detection unit. The battery cells are then combined with the associated cell voltage detection unit to form a battery module. The individual cell voltage detection units are then interconnected via a communications bus to form a chain, which is connected to the microcontroller, which forms the heart of the control unit, via an individual isolator module. However, there is now the problem that the measurement of the battery current also needs to take place taking into consideration the safety specifications. In this case, magnetic-field-based or voltage-based methods for current measurement can be used. The magnetic-field-based current measurement is in principle easy to implement with electrical isolation, but can only be implemented at high cost. The inexpensive and simple measurement by the measurement of a voltage at a resistor arranged in the current path of the battery with a known resistance value (shunt principle), on the other hand, can be implemented at low cost, but would require an additional isolator module.

Where reference is made to a battery in the context of the disclosure, this can also be intended to mean a battery cell string of a battery with a plurality of battery cell strings connected in parallel.

SUMMARY

According to the disclosure, therefore, a battery with a plurality of battery cells connected in series between a positive terminal and a negative terminal and a plurality of cell voltage detection units is introduced. The cell voltage detection units each have a plurality of voltage measurement inputs connected to a group of battery cells and are configured to determine cell voltages of the battery cells connected to the respective cell voltage detection unit. The cell voltage detection units are connected to one another by a communications bus and are also configured to communicate the determined cell voltages via the communications bus to a microcontroller, which is DC-decoupled from the cell voltage detection units by a electrical isolation apparatus. According to the disclosure, the battery has a resistor connected in series with the battery cells. At least one first connection of the resistor is connected to a selected voltage measurement input of one of the cell voltage detection units.

The disclosure provides the advantage that only one isolator module is required for the measurement of both the cell voltages and the current flowing through the battery and nevertheless inexpensive indirect measurement of the current can be used by measurement of the voltage at a resistor with a known resistance value. For this, the current measurement is implemented via one of the cell voltage detection units, with the result that a measured value which is representative of the current flowing through the battery can be communicated to the microcontroller in the same way as a cell voltage and together with the cell voltages of the battery cells, without any additional complexity in terms of isolation/electrical isolation. In addition, it is advantageous that this measured current value is determined in synchronism with the cell voltages because the same module is used for the measurement of the cell voltages and the measured current value.

Preferably, the battery has an amplifier, which is connected between the resistor and the selected voltage measurement input of said one of the cell voltage detection units and is designed to amplify a voltage present across the resistor. The use of the amplifier makes it possible to use a resistor with a very low resistance value for the current measurement since the correspondingly low voltage drop across this resistor is amplified for the detection by the cell voltage detection unit. This is advantageous because the internal resistance of the battery is only slightly increased by the resistor and correspondingly low levels of power loss and heat loss are produced by the resistor owing to its low resistance value.

A gain factor of the amplifier can be predetermined in such a way that a maximum permissible current of the battery effects an output voltage of the amplifier which is lower than a maximum permissible input voltage of the voltage measurement inputs of said one cell voltage detection unit. This ensures that the cell voltage detection unit can detect the current of the battery over the entire relevant measurement range and can also identify when the maximum permissible battery current is exceeded.

In this case, the gain factor of the amplifier is preferably predetermined in such a way that a maximum permissible current of the battery effects an output voltage of the amplifier which is also lower than a maximum permissible cell voltage of the battery cells or equal to the maximum permissible cell voltage of the battery cells. This embodiment of the disclosure has the advantage that the maximum voltage which needs to be processed for the current measurement by the cell voltage detection unit corresponds to a maximum permissible cell voltage, with the result that identical processing approaches for both cell voltages and the measured current value can be used.

Preferably, the amplifier has a first supply voltage connection for a lower supply voltage and a second supply voltage connection for an upper supply voltage. In this case, the first supply voltage connection is connected to a first battery cell of the battery cells connected to said one cell voltage detection unit and the second supply voltage connection is connected to a second battery cell of the battery cells connected to said one cell voltage detection unit.

In a first embodiment, in this case the first supply voltage connection is connected directly to the first battery cell of the battery cells connected to said one cell voltage detection unit and the second supply voltage connection is connected directly to the second battery cell of the battery cells connected to said one cell voltage detection unit, with the result that the amplifier is supplied directly from the battery cells.

In an alternative embodiment, a DC-to-DC converter is provided, which connects the first supply voltage connection to the first battery cell of the battery cells connected to said one cell voltage detection unit and the second supply voltage connection to the second battery cell of the battery cells connected to said one cell voltage detection unit and is designed to produce the upper supply voltage and the lower supply voltage and to output said voltages to the amplifier. The DC-to-DC converter provides the advantage of producing a supply voltage which is independent of a state of charge of the battery cells, for example.

The battery can have m cell voltage detection units, wherein each of the cell voltage detection units comprises n voltage measurement inputs and the battery has m*n−1 battery cells connected in series. In this variant embodiment, advantageously only identically designed cell voltage detection units are used, wherein a battery cell is less connected to one of the cell voltage detection units than to the remaining cell voltage detection units, and the free voltage measurement input is used for the current measurement. The use of identically designed components enables more efficient and therefore less expensive production.

Alternatively, the battery can have m cell voltage detection units, wherein each of the cell voltage detection units comprises n voltage measurement inputs and the battery has m*n−m battery cells connected in series. In this case, the same number of battery cells is connected to all cell voltage detection units, with the result that, in each cell voltage detection unit, a voltage measurement input remains free and identical battery modules, each having a cell voltage detection unit and comprising n−1 battery cells, are produced. In the case of one of the cell voltage detection units, this voltage measurement input is then used for the current measurement. This embodiment provides the advantage that identically designed battery modules are used and additional contact-making for the current measurement only needs to be provided for one battery module.

Particularly preferably, the battery has lithium-ion battery cells, which are particularly suitable owing to their high cell voltage and the favorable ratio of volume to maximum stored energy.

A second aspect of the disclosure introduces a motor vehicle comprising an electric drive motor for driving the motor vehicle and a battery in accordance with the first aspect of the disclosure connected to the drive motor.

BRIEF DESCRIPTION OF THE DRAWINGS

Exemplary embodiments of the disclosure will be explained in more detail with reference to the drawings and the description below. In the drawings.

DETAILED DESCRIPTION

In the figures, the same reference symbols refer to identical or similar functional units. Where not described otherwise, therefore, statements in respect of the other figures apply correspondingly.

Figure 1:
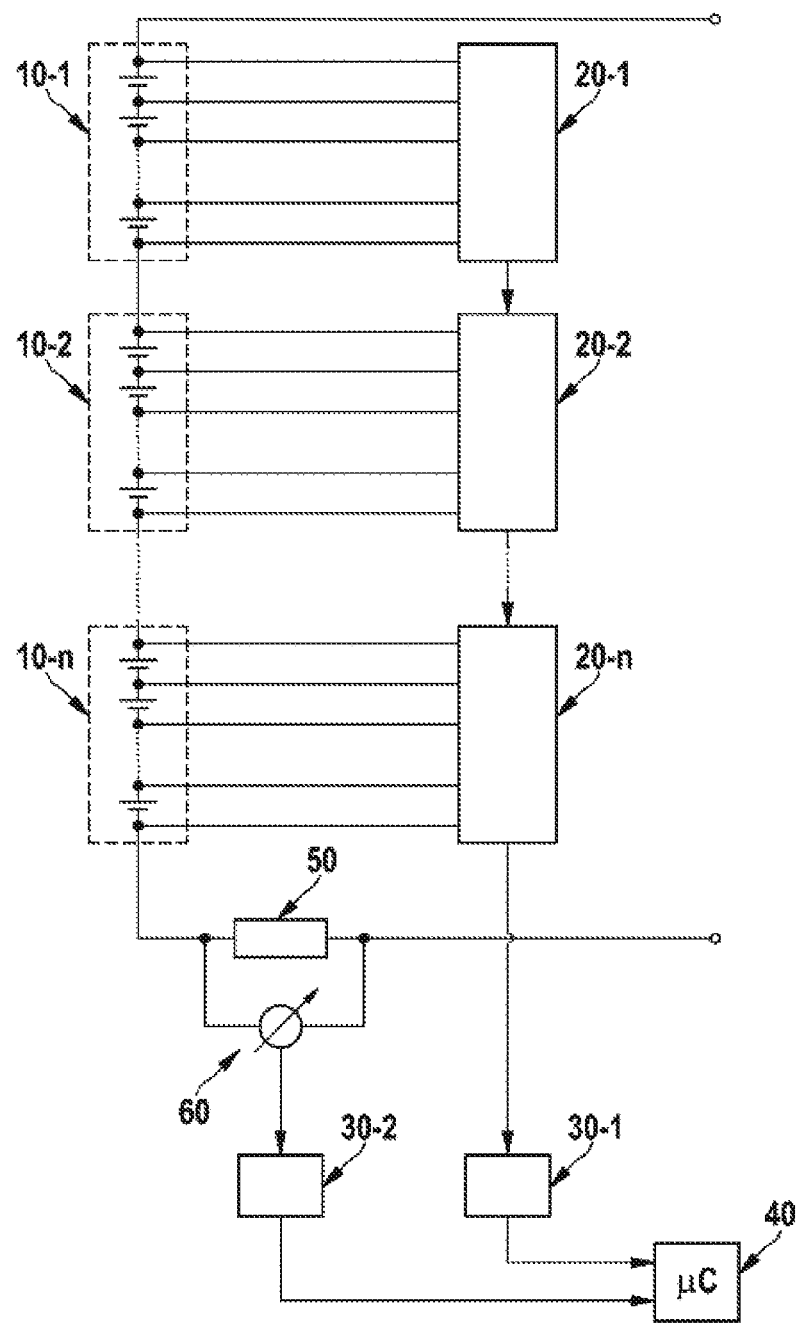
FIG. 1 shows a battery system in accordance with the prior art.

FIG. 1 shows a battery system in accordance with the prior art. A large number of battery cells is connected in series between a positive terminal and a negative terminal, with the result that a battery cell string is produced. The example shown has one battery cell string. However, it is also possible for a plurality of such battery cell strings to be connected in parallel in order to increase the available power and the capacity of the battery system. The battery cells are divided into groups 10-1 to 10-n, which preferably each have the same number of battery cells. However, the groups of battery cells can also have different numbers of battery cells. Each group of battery cells 10-1 to 10-n is connected to an associated cell voltage detection unit 20-1 to 20-n, which units are designed to detect the cell voltages of the battery cells. In addition, the cell voltage detections units 20-1 to 20-n can be designed to determine further operational parameters such as, for example, the temperature of one or all battery cells. The cell voltage detection units 20-1 to 20-n are connected to one another by a communications bus, which is connected to a microcontroller 40 of a battery control unit (BCU) via an isolator module 30-1 (electrical isolation apparatus). The cell voltage detection units 20-1 to 20-n communicate the detected cell voltages of the battery cells via the communications bus and the isolator module 30-1 to the microcontroller 40, which can determine, for example, states of charge of the battery cells and other parameters of the battery system on the basis of these data. Owing to the interconnection of the cell voltage detection units 20-1 to 20-n via the communications bus, only one isolator module 30-1 is required in order to communicate all cell voltages to the microcontroller 40, despite the possibly high number of cell voltage detection units 20-1 to 20-n.

The battery current is usually intended to be determined in a battery system as further important operational parameter. For this, a resistor 50 can be provided which is connected into the current path and has a known resistance value which is as low as possible. Then, the voltage across the resistor 50 is measured using a voltage measurement unit 60, which permits a direct conclusion to be drawn on the current flowing. The value measured by the voltage measurement unit 60 needs to be communicated to the microcontroller f 40 via a further isolator module 30-2, however, because the voltage measurement unit 60 is in conductive contact with the battery, with the result that, in the event of a fault, there would be a safety risk owing to the high battery voltage.

Figure 2:
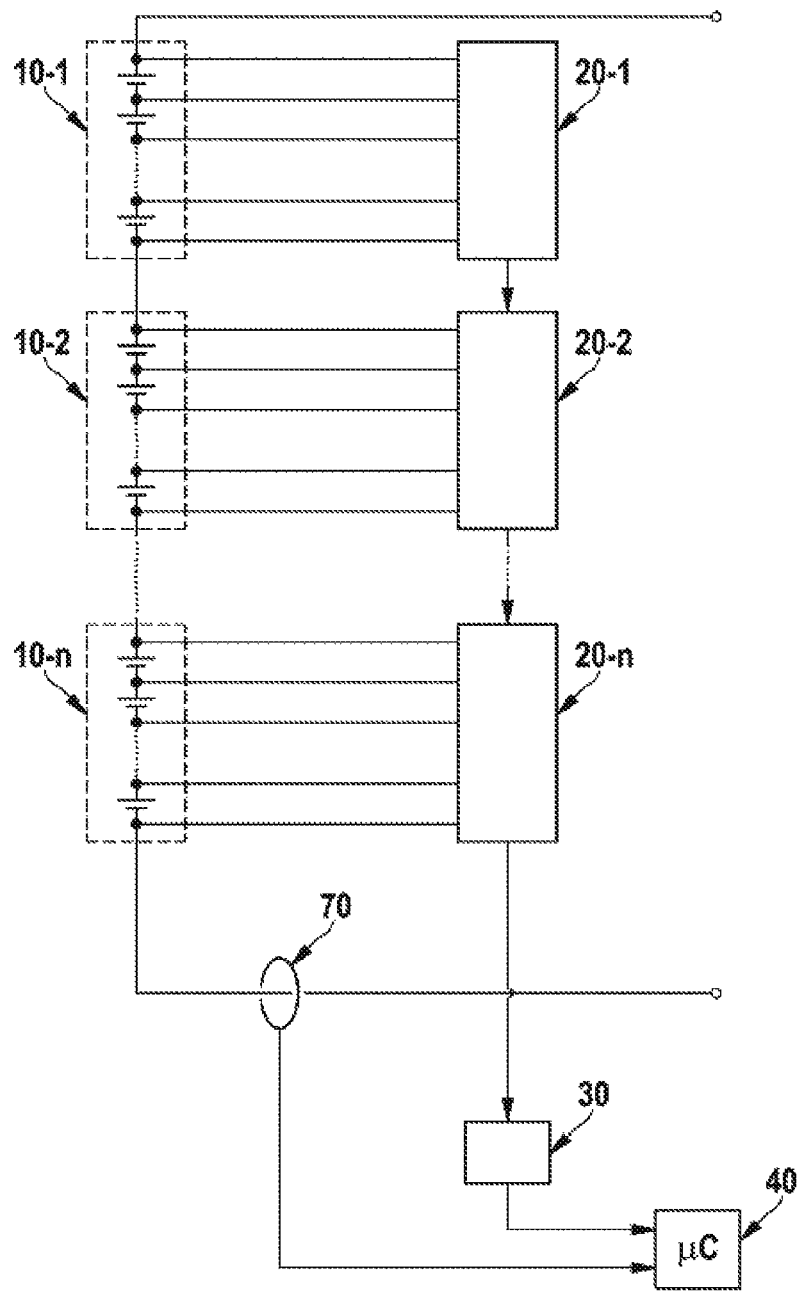
FIG. 2 shows a further battery system in accordance with the prior art.

FIG. 2 shows a further battery system in accordance with the prior art. In contrast to the example shown in FIG. 1, a magnetic field sensor 70, for example a Hall probe, is used for measuring the current. Since such a magnetic field sensor 70 measures the current flowing indirectly via the magnetic field surrounding the current-conducting conductor, said sensor can easily be constructed in such a way that it does not touch parts of the battery system which carry a high voltage and therefore is made so as to satisfy safety specifications. Therefore, the magnetic field sensor 70 can be linked to the microcontroller 40 directly, i.e. without a second isolator module. Despite the fact that the expensive second isolator module from the example in FIG. 1 is dispensed with, however, this embodiment has the disadvantage that a magnetic field sensor can only be implemented at great expense in comparison with the current measurement via a resistor as shown in FIG. 1.

Figure 3:
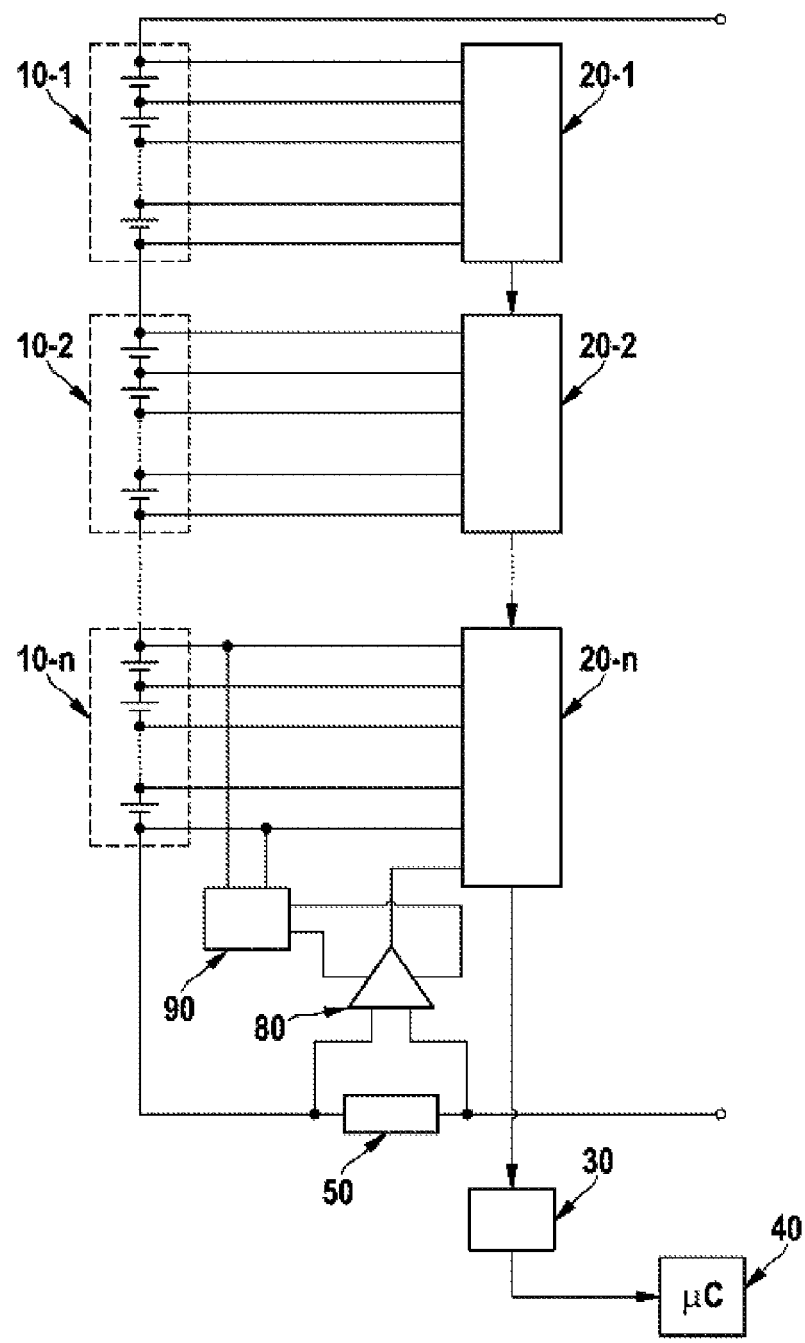
FIG. 3 shows an exemplary embodiment of the disclosure.

FIG. 3 shows an exemplary embodiment of the disclosure. According to the disclosure, a resistor 50 for measuring the battery current is connected into the current path. Optionally, an amplifier 80 can be provided, which amplifies the voltage across the resistor 50 to a suitable value range. The amplifier 80 can be supplied directly from the battery cells of a group of battery cells, i.e. can have supply lines connected directly to the battery cells, or else, as shown in FIG. 3, via a DC-to-DC converter 90, which is connected between the amplifier 80 and the battery cells. In this case, the amplifier 80 is connected indirectly to the battery cells.

The DC-to-DC converter 90 has the function of producing a supply voltage which is stable and independent of the states of charge and therefore the cell voltages of the battery cells for the amplifier 80. The output of the amplifier (or in embodiments of the disclosure without an amplifier 80, at least one connection of the resistor 50) is connected to a voltage measurement input of one of the cell voltage detection units 20-1 to 20-*n*, in the example shown the cell voltage detection unit 20-*b*, in accordance with the disclosure. The cell voltage detection unit 20-*n* detects the output voltage of the amplifier 80 in a similar or identical manner to the cell voltages of the battery cells and communicates the output voltage detected in this way of the amplifier 80 together with the detected cell voltages via the communications bus and the isolator module 30 to the microcontroller 40 of the BCU. The disclosure thus makes it possible to provide only one isolator module 30 and nevertheless to use the less expensive current measurement method without infringing the valid safety specifications. The cell voltage detection unit 20-*n* can have an additional voltage measurement input in comparison with the other cell voltage detection units for this purpose. However, preferably all of the cell voltage detections units 20-1 to 20-*n* have an identical design. This means that either a voltage measurement input of the further cell voltage detection units remains unused or else the group of battery cells which is connected to the cell voltage detection unit 20-*n* has one battery cell fewer than the other groups of battery cells.

The disclosure advantageously enables the use of already existing cell voltage detection units which are produced as ICs in large production numbers.

The invention claimed is:

1. A battery comprising:
    a plurality of battery cells connected in series between a positive terminal and negative terminal;
    a resistor connected in series with the plurality of battery cells;
    a plurality of cell voltage detection units, which each have a plurality of voltage measurement inputs connected to a respective group of battery cells of the plurality of battery cells, each cell voltage detection unit being configured to determine cell voltages of the connected respective group of battery cells; and
    an amplifier connected between the resistor and the selected voltage measurement input of said one of the cell voltage detection units, the amplifier configured to amplify a voltage present across the resistor, wherein:
        the cell voltage detection units of the plurality of cell voltage detection units are connected to one another by a communications bus and are configured to communicate the determined cell voltages via the communications bus to a microcontroller, which is DC-decoupled from the cell voltage detection units by an electrical isolation apparatus,
            a gain factor of the amplifier is predetermined such that a maximum permissible current of the battery effects an output voltage of the amplifier, which is lower than a maximum permissible input voltage of voltage measurement inputs of said one of the cell voltage detection units, and
        the resistor has at least one first connection connected to a selected voltage measurement input of one of the cell voltage detection units.

2. The battery as claimed in claim 1, wherein the gain factor of the amplifier is predetermined such that the maximum permissible current of the battery effects the output voltage of the amplifier which is also lower than or equal to a maximum permissible cell voltage of the plurality of battery cells.

3. The battery as claimed in claim 1, wherein:
    the amplifier has a first supply voltage connection for a lower supply voltage and a second supply voltage connection for an upper supply voltage, and
    the first supply voltage connection is connected to a first battery cell of battery cells connected to said one of the cell voltage detection units and the second supply voltage connection is connected to a second battery cell of the battery cells connected to said one of the cell voltage detection units.

4. The battery as claimed in claim 3, wherein the first supply voltage connection is connected directly to the first battery cell of the battery cells connected to said one of the cell voltage detection units and the second supply voltage connection is connected directly to the second battery cell of the battery cells connected to said one of the cell voltage detection units.

5. The battery as claimed in claim 3, further comprising a DC-to-DC converter configured to connect the first supply voltage connection to the first battery cell of the battery cells connected to said one of the cell voltage detection units and configured to connect the second supply voltage connection to the second battery cell of the battery cells connected to said one of the cell voltage detection units and configured to generate the upper supply voltage and the lower supply voltage and to output said voltages to the amplifier.

6. The battery as claimed in claim 3, wherein:
    said battery has a number of cell voltage detection units,
    each of the cell voltage detection units has a number of voltage measurement inputs,
    the battery has a number of battery cells equal to the number of cell voltage detection units multiplied by two less than the number of voltage measurement inputs, and
    the number of battery cells are connected in series.

7. The battery as claimed in claim 3, wherein:
the battery has a number of cell voltage detection units, each of the cell voltage detection units includes a number of voltage measurement inputs,
the battery has a number of battery cells equal to the number of cell voltage detection units multiplied by the number of cell voltage detection units less than one less than the number of voltage measurement inputs, and
the number of battery cells are connected in series.

8. A motor vehicle comprising:
an electric drive motor for driving the motor vehicle; and
a battery connected to the drive motor, the battery including:
  a plurality of battery cells connected in series between a positive terminal and negative terminal;
  a resistor connected in series with the plurality of battery cells;
  an amplifier connected between the resistor and the selected voltage measurement input of said one of the cell voltage detection units, the amplifier configured to amplify a voltage present across the resistor: and
  a plurality of cell voltage detection units, which each have a plurality of voltage measurement inputs connected to a respective group of battery cells of the plurality of battery cells, each cell voltage detection unit being configured to determine cell voltages of the connected respective group of battery cells, wherein:
    each cell voltage detection unit of the plurality of cell voltage detection units is connected to one another by a communications bus and is configured to communicate the determined cell voltages via the communications bus to a microcontroller which is DC-decoupled from the cell voltage detection units by an electrical isolation apparatus,
    a gain factor of the amplifier is predetermined such that a maximum permissible current of the battery effects an output voltage of the amplifier, which is lower than a maximum permissible input voltage of voltage measurement inputs of said one of the cell voltage detection units, and
    the resistor has at least one first connection connected to a selected voltage measurement input of one of the cell voltage detection units.

9. A battery comprising:
a plurality of battery cells connected in series between a positive terminal and negative terminal;
a resistor connected in series with the plurality of battery cells;
a plurality of cell voltage detection units, which each have a plurality of voltage measurement inputs connected to a respective group of battery cells of the plurality of battery cells, each cell voltage detection unit being configured to determine cell voltages of the connected respective group of battery cells;
an amplifier connected between the resistor and the selected voltage measurement input of said one of the cell voltage detection units, the amplifier configured to amplify a voltage present across the resistor, the amplifier including a first supply voltage connection for a lower supply voltage and a second supply voltage connection for an upper supply voltage; and
a DC-to-DC converter configured to connect the first supply voltage connection to the first battery cell of the battery cells connected to said one of the cell voltage detection units and configured to connect the second supply voltage connection to the second battery cell of the battery cells connected to said one of the cell voltage detection units and configured to generate the upper supply voltage and the lower supply voltage and to output said voltages to the amplifier, wherein:
  the cell voltage detection units of the plurality of cell voltage detection units are connected to one another by a communications bus and are configured to communicate the determined cell voltages via the communications bus to a microcontroller, which is DC-decoupled from the cell voltage detection units by an electrical isolation apparatus;
  the first supply voltage connection is connected to a first battery cell of battery cells connected to said one of the cell voltage detection units and the second supply voltage connection is connected to a second battery cell of the battery cells connected to said one of the cell voltage detection units; and
  the resistor has at least one first connection connected to a selected voltage measurement input of one of the cell voltage detection units.

\* \* \* \* \*